(12) United States Patent
Geldman et al.

(10) Patent No.: US 10,546,092 B2
(45) Date of Patent: Jan. 28, 2020

(54) MODIFYING A CIRCUIT DESIGN BASED ON PRE-ROUTED TOP LEVEL DESIGN

(71) Applicant: INTERNATIONAL BUSINESS MACHINES CORPORATION, Armonk, NY (US)

(72) Inventors: Ido Geldman, Tel-Aviv (IL); Ofer Geva, Hod Hasharon (IL); Rina Kipnis, Kiriat Motskin (IL); Vadim Liberchuk, Karmiel (IL); Yaniv Maroz, Kiryat Ono (IL); Asaf Regev, Ramat Gan (IL)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 97 days.

(21) Appl. No.: 15/843,384

(22) Filed: Dec. 15, 2017

(65) Prior Publication Data

US 2019/0188351 A1 Jun. 20, 2019

(51) Int. Cl.
*G06F 17/50* (2006.01)

(52) U.S. Cl.
CPC .............. *G06F 17/5072* (2013.01)

(58) Field of Classification Search
CPC ............. G06F 17/5077; G06F 17/5072; G06F 17/505; G06F 17/5068
USPC .................. 716/119, 126–130, 139
See application file for complete search history.

(56) References Cited

U.S. PATENT DOCUMENTS

| | | | |
|---|---|---|---|
| 6,567,967 B2* | 5/2003 | Greidinger | G06F 17/5077 716/108 |
| 7,114,142 B1 | 9/2006 | Segal et al. | |
| 8,375,345 B1 | 2/2013 | Barowski et al. | |
| 8,397,190 B2* | 3/2013 | Kenney | G06F 17/505 703/13 |
| 9,858,377 B2* | 1/2018 | Berry | G06F 17/5072 |
| 2008/0184184 A1* | 7/2008 | McCracken | G06F 17/5045 716/113 |
| 2016/0232276 A1 | 8/2016 | Daellenbach et al. | |

* cited by examiner

*Primary Examiner* — Nghia M Doan
(74) *Attorney, Agent, or Firm* — Cantor Colburn LLP; Margaret McNamara

(57) ABSTRACT

In some examples, a system for modifying circuit can include a processor to detect a previous routed top level circuit design that was proven to close timing within a predetermined range and congestion below a threshold level. The processor can also detect a new pin to be added to a new circuit design and detect user input indicating a bounding box corresponding to a new macro boundary in the previous routed top level circuit design. Additionally, the processor can identify a location of a net in the previous circuit design corresponding to the new pin, wherein the new pin is placed at an intersection between the net and the bounding box. Furthermore, the processor can manufacture a circuit based on the previous circuit design and the placement of the new pin at the intersection between the net and the bounding box.

17 Claims, 6 Drawing Sheets

MODIFYING A CIRCUIT DESIGN BASED ON PRE-ROUTED TOP LEVEL DESIGN

BACKGROUND

The present disclosure relates to circuit designs, and more specifically, but not exclusively, to modifying a circuit design based on a pre-routed top level design.

SUMMARY

According to an embodiment described herein, a system for modifying a circuit based on pre routed top level designs can include a processor that can detect a previous routed top level circuit design that was proven to close timing within a predetermined range and congestion below a threshold level. The processor can also detect a new pin to be added to a new circuit design and detect user input indicating a bounding box corresponding to a new macro boundary in the previous routed top level circuit design. Additionally, the processor can identify a location of a net in the previous circuit design corresponding to the new pin, wherein the new pin is placed at an intersection between the net and the bounding box. Furthermore, the processor can manufacture a circuit based on the previous circuit design and the placement of the new pin at the intersection between the net and the bounding box.

According to another embodiment, a method for modifying a circuit based on pre routed top level designs can include detecting a previous routed top level circuit design that was proven to close timing within a predetermined range and congestion below a threshold level. The method can also include detecting a new pin to be added to a new circuit design and detecting user input indicating a bounding box corresponding to a new macro boundary in the previous routed top level circuit design. Additionally, the method can include identifying a location of a net in the previous circuit design corresponding to the new pin, wherein the new pin is placed at an intersection between the net and the bounding box. Furthermore, the method can include manufacturing a circuit based on the previous circuit design and the placement of the new pin at the intersection between the net and the bounding box.

According to another embodiment, a computer program product for modifying a circuit based on pre routed top level designs can include a computer readable storage medium having program instructions embodied therewith, wherein the computer readable storage medium is not a transitory signal per se. The program instructions can be executable by a processor to cause the processor to detect a previous routed top level circuit design that was proven to close timing within a predetermined range and congestion below a threshold level. The program instructions can also be executable by a processor to cause the processor to detect a new pin to be added to a new circuit design and detect user input indicating a bounding box corresponding to a new macro boundary in the previous routed top level circuit design. Additionally, program instructions can also be executable by a processor to cause the processor to identify a location of a net in the previous circuit design corresponding to the new pin, wherein the new pin is placed at an intersection between the net and the bounding box, and manufacture a circuit based on the previous circuit design and the placement of the new pin at the intersection between the net and the bounding box.

DETAILED DESCRIPTION

Figure 1:
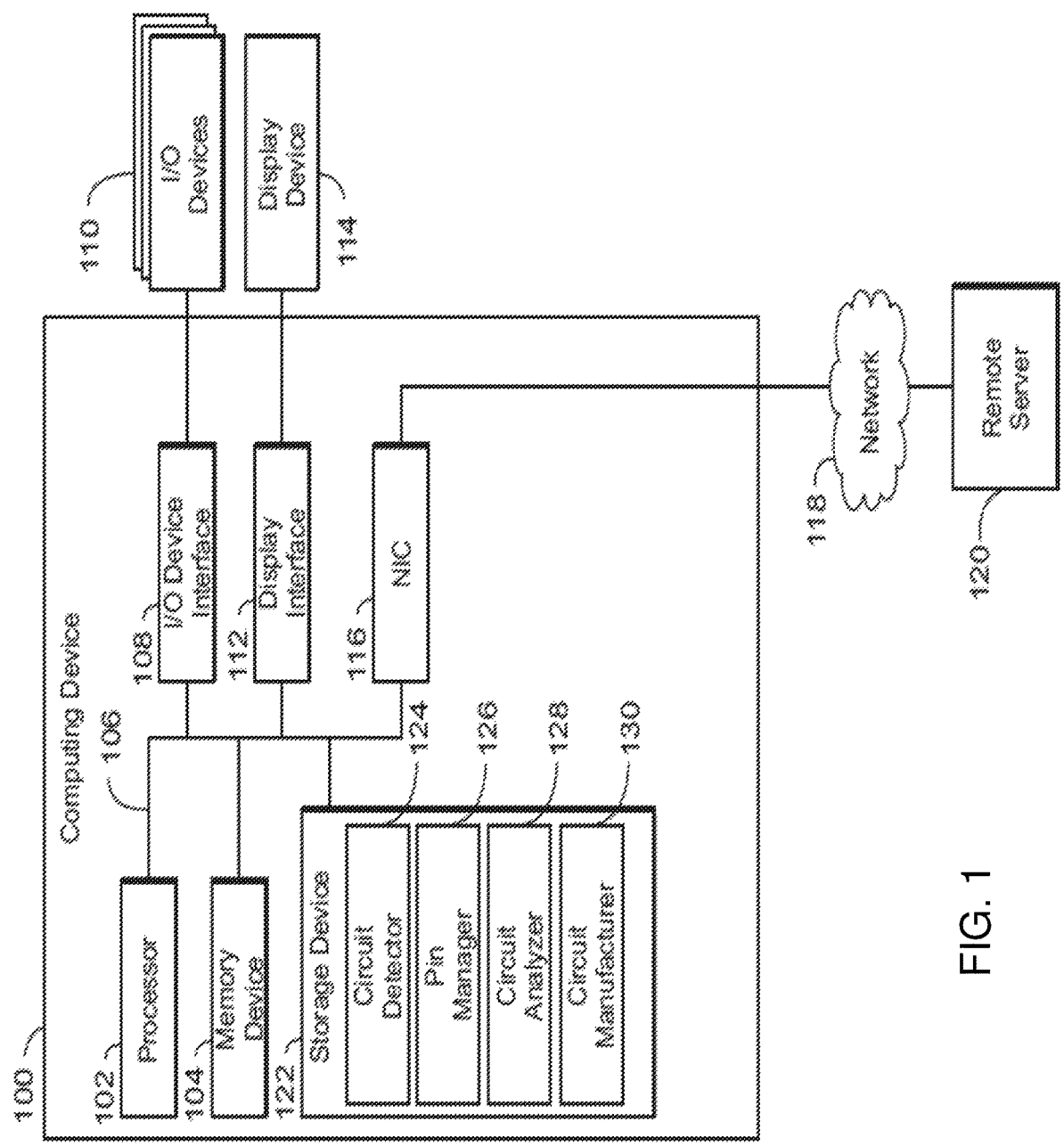
FIG. 1 depicts a block diagram of an example computing system that can modify a circuit based on pre routed top level designs according to an embodiment described herein.

Static timing analysis (STA) is a technique for simulating the expected timing of a digital circuit without requiring a simulation of the full circuit. In some examples, high performance integrated circuits have traditionally been characterized by the clock frequency at which the integrated circuits operate. Determining the ability of a circuit to operate at a specified speed may include measuring, during the design process, the delay within the circuit. Moreover, delay calculation can be incorporated into the inner loop of timing optimizers at various phases of design, such as logic synthesis, layout (placement and routing), and in in-place optimizations performed late in the design cycle. Static timing analysis enables the fast and reasonably accurate measurement of circuit timing.

In some examples, the structure and behavior of electronic circuits and digital logic circuits can be described using a hardware description language (HDL). HDLs enable precise, formal descriptions of electronic circuits that allow for automated analysis and simulation. For example, the electronic circuits may include complex circuits such as application-specific integrated circuits (ASICs), microprocessors, and programmable logic devices (PLDs). HDLs are standard text-based expressions of the structure of electronic systems and their behavior over time. HDLs thus also include an explicit notion of time, which may be a primary attribute of hardware. For example, the Very High Speed Integrated Circuit (VHSIC) Hardware Description Language (VHDL) is an HDL used in electronic design automation to describe digital and mixed-signal systems such as field-programmable gate arrays and integrated circuits. A macro written in VHDL may include multiple design abstractions organized as a hierarchy. For example, a higher level of a hierarchy may be a register-transfer level (RTL). An RTL can be used to model a synchronous digital circuit in terms of the flow of digital signals (data) between hardware registers, and the logical operations performed on those signals. In some examples, lower-level representations and ultimately actual wiring can be derived from higher level representations.

In some embodiments described herein, a device for designing a circuit can detect a previous pre-routed top level circuit design that was proven to close timing within a predetermined range and congestion below a threshold level. A pre-routed top level design, as referred to herein, can include any suitable circuit design that satisfies timing constraints based on previously executed simulation tests. The device can also detect a new pin to be added to a new circuit design and detect user input indicating a bounding box corresponding to a new macro boundary in the previous routed top level circuit design. Additionally, the device can identify a location of a net in the previous circuit design corresponding to the new pin, wherein the new pin is placed at an intersection between the net and the bounding box. Furthermore, the device can manufacture a circuit based on the previous circuit design and the placement of the new pin at the intersection between the net and the bounding box.

Accordingly, the techniques described herein can enable the design and manufacture of a new circuit based on new pins added to macros from existing circuit designs that are to be included in the new circuit. Therefore, the techniques described herein can rely upon timing constraints previously analyzed and approved in previous circuit designs. In some embodiments, a new circuit can be generated that includes multiple smaller macros from previous circuit designs along with new pins connected to new macro boundaries in the new circuit.

With reference now to FIG. 1, an example computing device is depicted that can modify a circuit based on a pre-routed top level designs. The computing device 100 may be for example, a server, desktop computer, laptop computer, tablet computer, or smartphone. In some examples, computing device 100 may be a cloud computing node. Computing device 100 may be described in the general context of computer system executable instructions, such as program modules, being executed by a computer system. Generally, program modules may include routines, programs, objects, components, logic, data structures, and so on that perform particular tasks or implement particular abstract data types. Computing device 100 may be practiced in distributed cloud computing environments where tasks are performed by remote processing devices that are linked through a communications network. In a distributed cloud computing environment, program modules may be located in both local and remote computer system storage media including memory storage devices.

The computing device 100 may include a processor 102 that is adapted to execute stored instructions, a memory device 104 to provide temporary memory space for operations of said instructions during operation. The processor can be a single-core processor, multi-core processor, computing cluster, or any number of other configurations. The memory 104 can include random access memory (RAM), read only memory, flash memory, or any other suitable memory systems.

The processor 102 may be connected through a system interconnect 106 (e.g., PCI®, PCI-Express®, etc.) to an input/output (I/O) device interface 108 adapted to connect the computing device 100 to one or more I/O devices 110. The I/O devices 110 may include, for example, a keyboard and a pointing device, wherein the pointing device may include a touchpad or a touchscreen, among others. The I/O devices 110 may be built-in components of the computing device 100, or may be devices that are externally connected to the computing device 100.

The processor 102 may also be linked through the system interconnect 106 to a display interface 112 adapted to connect the computing device 100 to a display device 114. The display device 114 may include a display screen that is a built-in component of the computing device 100. The display device 114 may also include a computer monitor, television, or projector, among others, that is externally connected to the computing device 100. In addition, a network interface controller (NIC) 116 may be adapted to connect the computing device 100 through the system interconnect 106 to the network 118. In some embodiments, the NIC 116 can transmit data using any suitable interface or protocol, such as the internet small computer system interface, among others. The network 118 may be a cellular network, a radio network, a wide area network (WAN), a local area network (LAN), or the Internet, among others. A remote server 120 may connect to the computing device 100 through the network 118.

The processor 102 may also be linked through the system interconnect 106 to a storage device 122 that can include a hard drive, an optical drive, a USB flash drive, an array of drives, or any combinations thereof. In some examples, the storage device 122 may include a circuit detector 124, a pin manager 126, a circuit analyzer 128, and a circuit manufacturer 130. In some embodiments, the circuit detector 124 can detect a previous routed top level circuit design that was proven to close timing within a predetermined range and congestion below a threshold level. In some embodiments, the pin manager 126 can detect a new pin to be added to a new circuit design. In some embodiments, the circuit analyzer 128 can detect user input indicating a bounding box corresponding to a new macro boundary in the previous routed top level circuit design and identify a location of a net in the previous circuit design corresponding to the new pin, wherein the new pin is placed at an intersection between the net and the bounding box. In some embodiments, the circuit manufacturer 130 can manufacture a circuit based on the previous circuit design and the placement of the new pin at the intersection between the net and the bounding box.

It is to be understood that the block diagram of FIG. 1 is not intended to indicate that the computing device 100 is to include all of the components shown in FIG. 1. Rather, the computing device 100 can include fewer or additional components not illustrated in FIG. 1 (e.g., additional memory components, embedded controllers, modules, additional network interfaces, etc.). Furthermore, any of the functionalities of the circuit detector 124, pin manager 126, circuit analyzer 128, and circuit manufacturer 130 may be partially, or entirely, implemented in hardware and/or in the processor 102. For example, the functionality may be implemented with an application specific integrated circuit, logic implemented in an embedded controller, or in logic implemented in the processor 102, among others. In some embodiments, the functionalities of the circuit detector 124, pin manager 126, circuit analyzer 128, and circuit manufacturer 130 can be implemented with logic, wherein the logic, as referred to herein, can include any suitable hardware (e.g., a processor, among others), software (e.g., an application, among others), firmware, or any suitable combination of hardware, software, and firmware.

Figure 2:
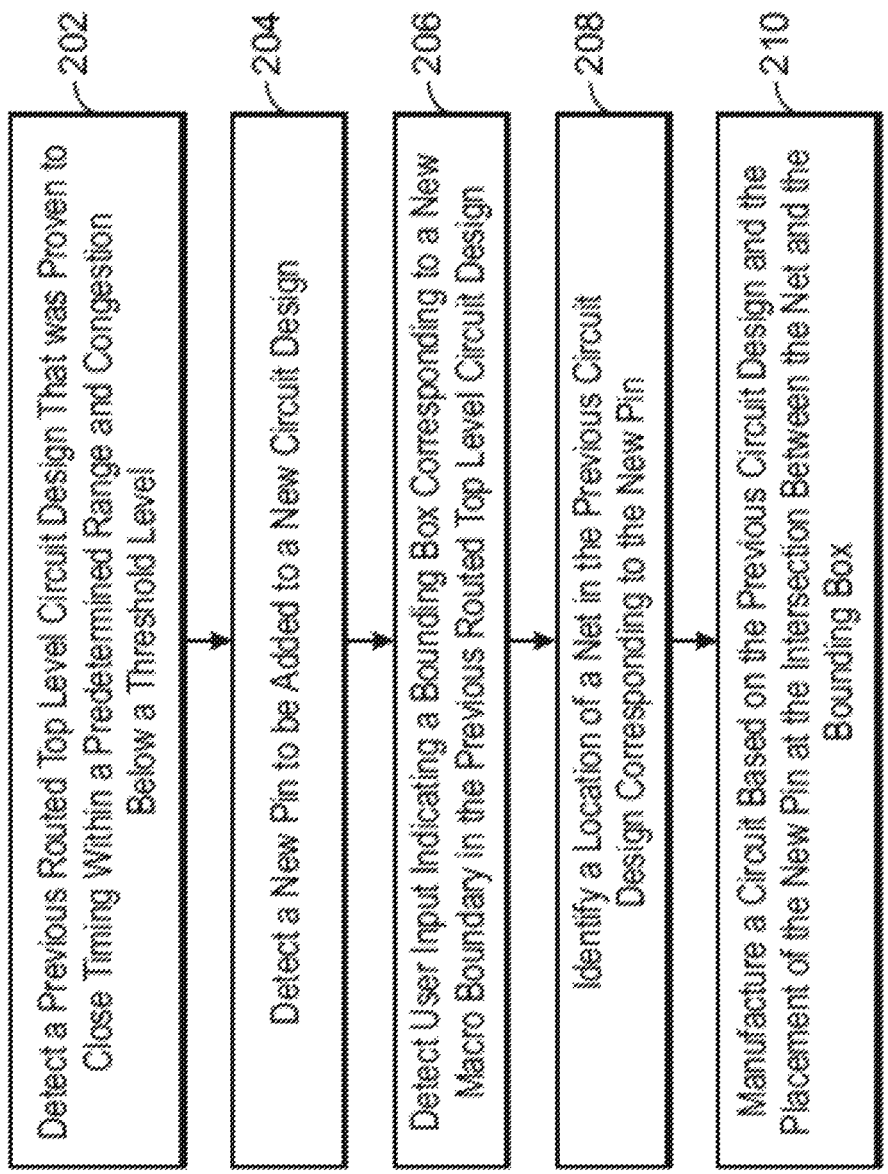
FIG. 2 is a process flow diagram of an example method that can modify a circuit based on pre routed top level designs according to an embodiment described herein.

FIG. 2 is a process flow diagram of an example method that can modify a circuit based on a pre-routed top level design. The method 200 can be implemented with any suitable computing device, such as the computing device 100 of FIG. 1.

At block 202, a circuit detector 124 can detect a previous routed top level circuit design that was proven to close timing within a predetermined range and congestion below a threshold level. For example, the circuit detector 124 can identify a circuit design from any suitable number of previous routed top level designs that can be modified to include a new pin while maintaining a timing within a range and a congestion below a threshold level. In some embodiments, the circuit detector 124 can analyze the timing of previous routed top level circuit designs based on negative and positive paths for the circuit designs. For example, the slack associated with each path in a circuit can be measured as the difference between the required range of time for the path to transmit an electrical signal and the estimated arrival time of an electrical signal using the path. In some examples, the estimated arrival time is based on a simulation or circuit timing test of the circuit. A positive slack implies that the arrival time at a gate or node in the circuit may be increased without affecting the overall delay of the circuit. Conversely, negative slack implies that a path is too slow, and the path can be sped up (or the reference signal delayed) if the whole circuit is to work at a desired speed. A path with negative slack is referred to herein as a negative path.

In some embodiments, the circuit detector 124 can group negative paths and positive paths based on macros or regions within a circuit. A macro, as referred to herein, can include a sub-division of a circuit based on related logic that performs a common task. For example, a macro can include logic performing an adder calculation, or logic performing address generation, among others.

In some embodiments, the circuit detector 124 can determine the timing of macros of a previous circuit design are within a predetermined range based on a timing report. In some embodiments, the timing report can indicate timing delays for any number of paths in an integrated circuit design. In some examples, the timing report can be provided by a remote device to a cloud service that executes the circuit detector 124. In other embodiments, the circuit detector 124 may detect the timing report on a local computing device. In some examples, the timing report can indicate an estimated time to transmit an electrical signal within a macro, or between multiple macros and multiple gates, among others. In some embodiments, the circuit detector 124 can indicate than a new pin for a macro is in a location that increases the amount of time to transmit an electrical signal beyond a threshold value.

At block 204, a pin manager 126 can detect a new pin to be added to a new circuit design. In some examples, one or more pins can be added to the new circuit design. For example, the pin manager 126 can detect pin names from a circuit design file such as a hardware description language file, or a VHDL file, among others.

At block 206, a circuit analyzer 128 can detect user input indicating a bounding box corresponding to a new macro boundary in the previous routed top level circuit design. For example, the bounding box can include any number of macros from the previous circuit design that are to be included in a single larger macro in the new circuit design. In some examples, the bounding box can include any suitable coordinates, or other indicators, that identify the edges of the bounding box. For example, the circuit analyzer 128 may assign a coordinate of (0,0) to any suitable corner of the bounding box. Any macro or pin residing in the bounding box can be assigned a coordinate based on a distance to the (0,0) coordinate.

At block 208, the circuit analyzer 128 can identify a location of a net in the previous circuit design corresponding to the new pin, wherein the new pin is placed at an intersection between the net and the bounding box. In some embodiments, the circuit analyzer 128 can determine the net is between a first macro within the bounding box and a second macro outside of the bounding box and detect a normalized location of the new pin based on an edge of the bounding box. As discussed above, the macros can include a sub-division of a circuit based on related logic that performs a common task. The bounding boxes can indicate edges of the macros where new pins can be placed. Accordingly, in some embodiments, the circuit analyzer 128 can also place the new pin at the normalized location of the edge of the bounding box. In some examples, the normalized location of the new pin is based on a coordinate corresponding to a corner or the edge of the bounding box. In some embodiments, the circuit analyzer 128 can search a plurality of buffers to identify the bounding box. In some embodiments, the circuit analyzer 128 can detect at least two nets in the previous circuit design for placing the new pin and select one of the at least two nets based on a level of congestion. For example, the circuit analyzer 128 can select a net for placing a new pin, wherein the net has a lower level of congestion and can transmit signals for the new pin without the congestion exceeding a congestion threshold. In some examples, the circuit analyzer 128 can identify a layer and a track for the new pin based on the net. In some examples, the circuit analyzer 128 can detect a size of the new pin based on a predetermined characteristic corresponding to a layer of the net.

At block 210, a circuit manufacturer 130 can manufacture a circuit based on the previous circuit design and the placement of the new pin at the intersection between the net and the bounding box. For example, the circuit manufacturer 130 can modify a simulation of a circuit or a manufacturing of a circuit based on the identified modifications that include the new pin. In some embodiments, the circuit manufacturer 130 can transmit instructions to an automated manufacturing device to manufacture a circuit with the new pin.

The process flow diagram of FIG. 2 is not intended to indicate that the operations of the method 200 are to be executed in any particular order, or that all of the operations of the method 200 are to be included in every case. For example, the method 200 can include detecting that a normalized location in the previous circuit design for placing the new pin cannot be located and generating a pin not found list and identify a location for the new pin based on a flight line between a first macro inside the bounding box and a second macro outside of the bounding box that is to be connected to the first macro and an intersection of the flight line with the bounding box.

Figure 3:
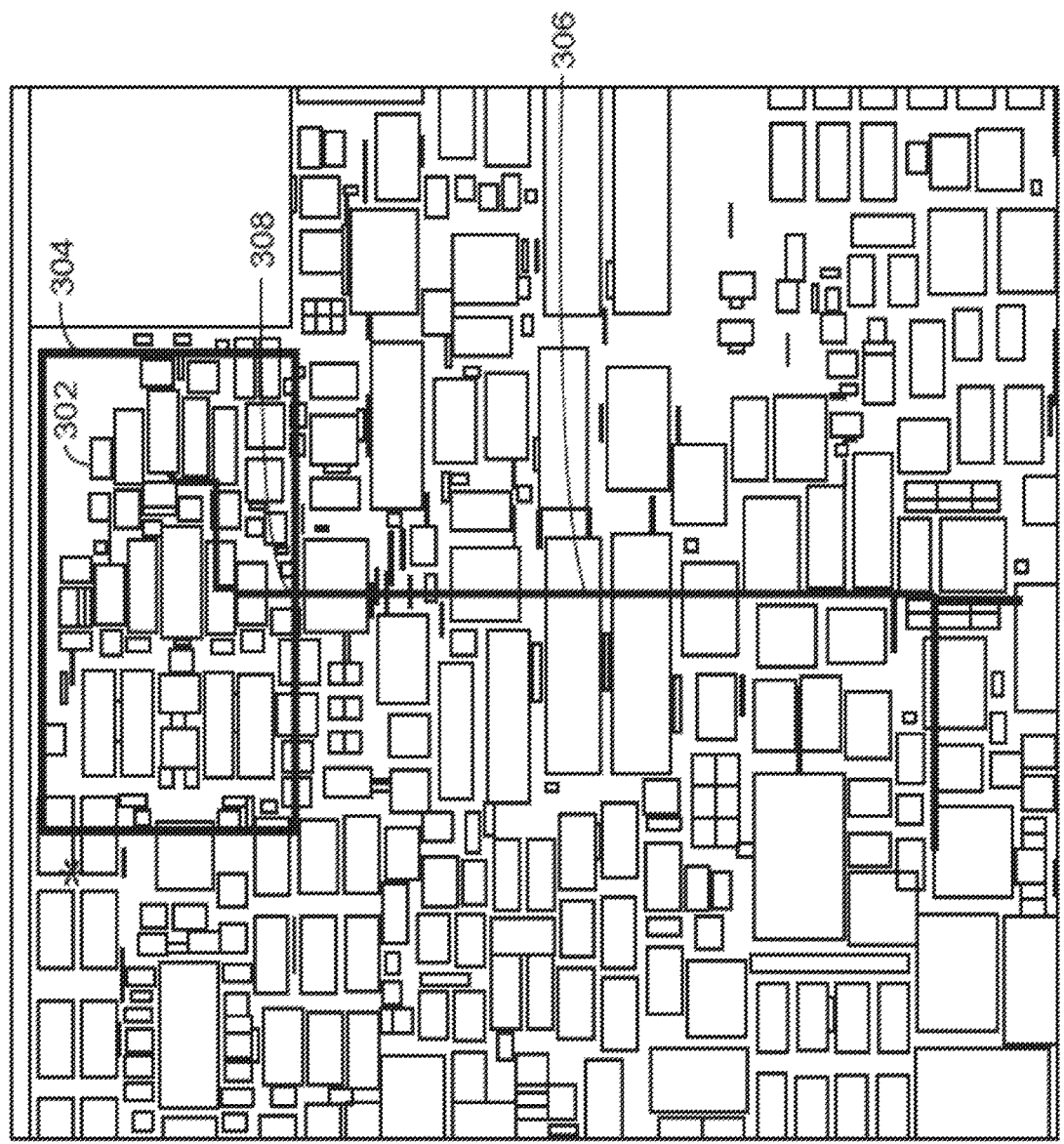
FIG. 3 is an example block diagram for adding a pin to an existing circuit.

FIG. 3 is an example block diagram for generating a new circuit design based on new pins and an existing circuit. In some examples, the previous routed top level circuit design can be proven to have timing within a predetermined range and congestion below a threshold level. In some embodiments, the new circuit design 300 can include any suitable number of macros 302 from the previous routed top level circuit design. In some examples, a new macro bounding box 304 can be detected as user input. The new macro bounding box 304 can indicate any number of macros from the previous routed top level circuit design to be included in a larger macro of the new circuit design 300. In some examples, a net or flight line 306 can connect a first macro within the new macro bounding box 304 to a second macro outside of the new macro bounding box 304. In some embodiments, a new pin can be placed at the intersection 308 of the net or flight light 306 and the new macro bounding box 304.

It is to be understood that the new circuit design 300 can include fewer or additional macros, macro bounding boxes, and nets. In some examples, any suitable number of pins can be added to any number of macros within bounding boxes of the new circuit design 300.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical functions. In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 4:
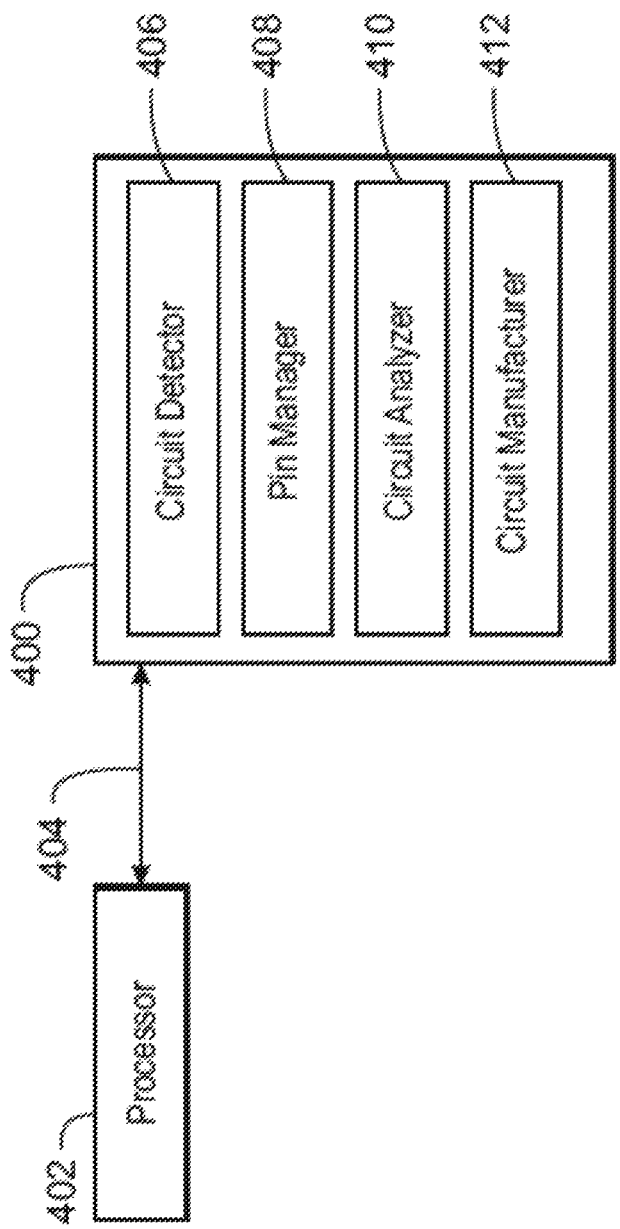
FIG. 4 is a tangible, non-transitory computer-readable medium that can modify a circuit based on pre routed top level designs according to an embodiment described herein.

Referring now to FIG. 4, a block diagram is depicted of an example of a tangible, non-transitory computer-readable medium that can modify a circuit based on a pre-routed top level design. The tangible, non-transitory, computer-readable medium 400 may be accessed by a processor 402 over a computer interconnect 404.

Furthermore, the tangible, non-transitory, computer-readable medium 400 may include code to direct the processor 402 to perform the operations of the current method. For example, a circuit detector 406 can detect a previous routed top level circuit design that was proven to close timing within a predetermined range and congestion below a threshold level. In some embodiments, a pin manager 408 can detect a new pin to be added to a new circuit design. In some embodiments, a circuit analyzer 410 can detect user input indicating a bounding box corresponding to a new macro boundary in the previous routed top level circuit design and identify a location of a net in the previous circuit design corresponding to the new pin, wherein the new pin is placed at an intersection between the net and the bounding box. In some embodiments, a circuit manufacturer 412 can manufacture a circuit based on the previous circuit design and the placement of the new pin at the intersection between the net and the bounding box.

It is to be understood that any number of additional software components not shown in FIG. 4 may be included within the tangible, non-transitory, computer-readable medium 400, depending on the specific application. Furthermore, fewer software components than those shown in FIG. 4 can be included in the tangible, non-transitory, computer-readable medium 400.

Figure 5:
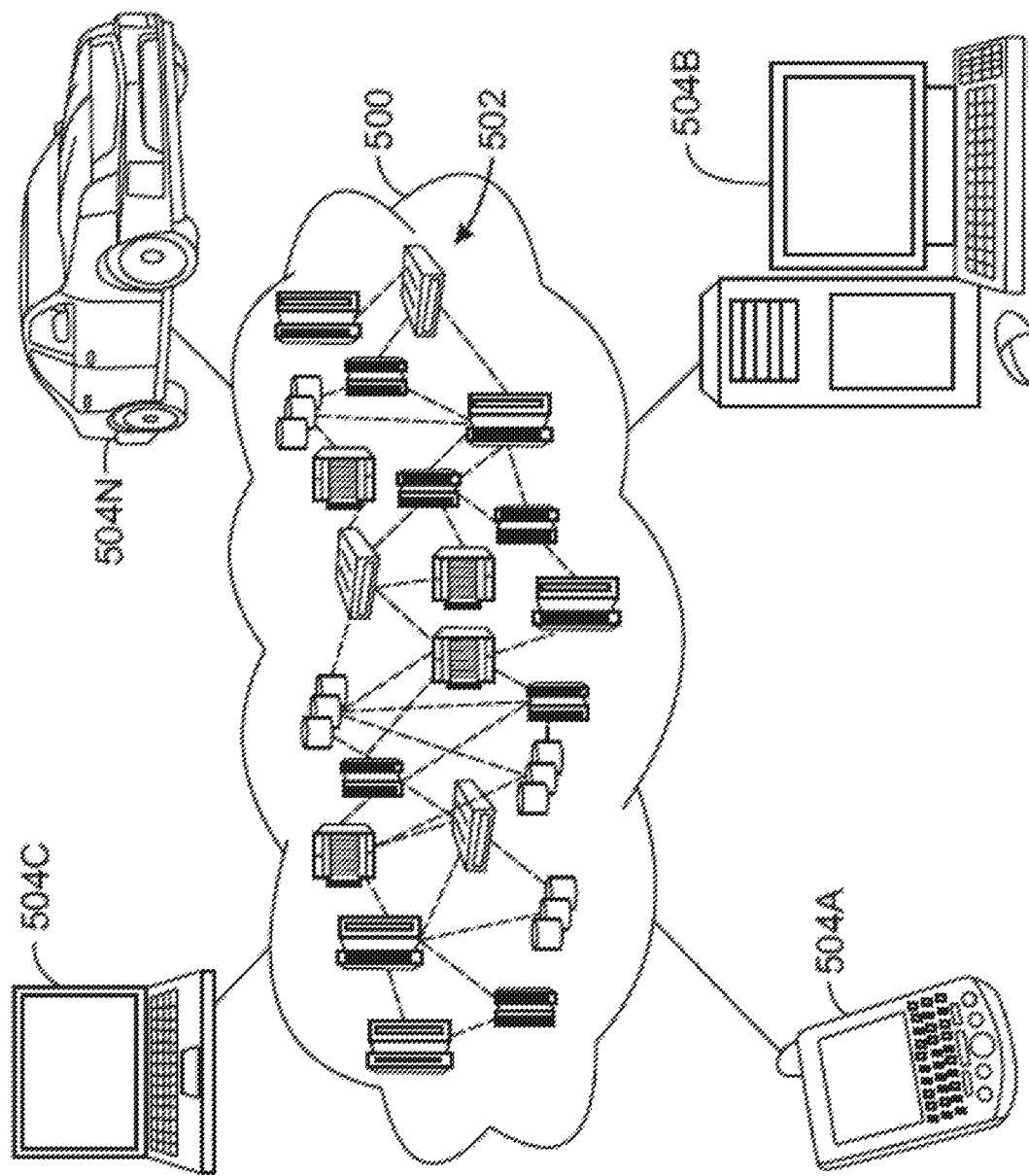
FIG. 5 depicts an illustrative cloud computing environment according to an embodiment described herein.

Referring now to FIG. 5, illustrative cloud computing environment 500 is depicted. As shown, cloud computing environment 500 comprises one or more cloud computing nodes 502 with which local computing devices used by cloud consumers, such as, for example, personal digital assistant (PDA) or cellular telephone 504A, desktop computer 504B, laptop computer 504C, and/or automobile computer system 504N may communicate. Nodes 502 may communicate with one another. They may be grouped (not shown) physically or virtually, in one or more networks, such as Private, Community, Public, or Hybrid clouds as described hereinabove, or a combination thereof. This allows cloud computing environment 500 to offer infrastructure, platforms and/or software as services for which a cloud consumer does not need to maintain resources on a local computing device. It is understood that the types of computing devices 504A-N shown in FIG. 5 are intended to be illustrative only and that computing nodes 502 and cloud computing environment 500 can communicate with any type of computerized device over any type of network and/or network addressable connection (e.g., using a web browser).

Figure 6:
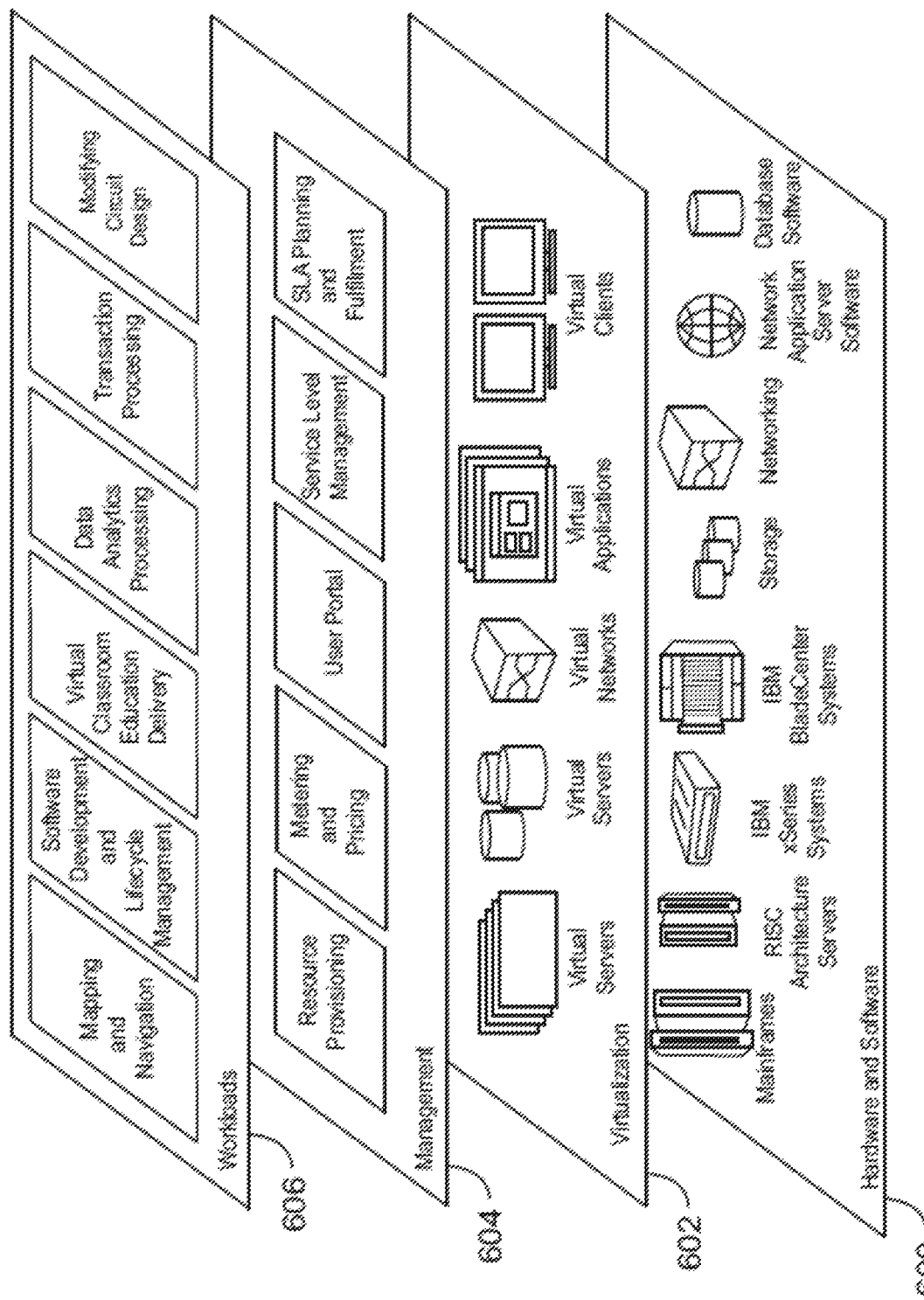
FIG. 6 depicts a set of functional abstraction layers provided by a cloud computing environment according to an embodiment described herein.

Referring now to FIG. 6, a set of functional abstraction layers provided by cloud computing environment 500 (FIG. 5) is shown. It should be understood in advance that the components, layers, and functions shown in FIG. 6 are intended to be illustrative only and embodiments of the invention are not limited thereto. As depicted, the following layers and corresponding functions are provided.

Hardware and software layer 600 includes hardware and software components. Examples of hardware components include mainframes, in one example IBM® zSeries® systems; RISC (Reduced Instruction Set Computer) architecture based servers, in one example IBM p Series® systems; IBM xSeries® systems; IBM BladeCenter® systems; storage devices; networks and networking components. Examples of software components include network application server software, in one example IBM Web Sphere® application server software; and database software, in one example IBM DB2® database software. (IBM, zSeries, pSeries, xSeries, BladeCenter, WebSphere, and DB2 are trademarks of International Business Machines Corporation registered in many jurisdictions worldwide).

Virtualization layer 602 provides an abstraction layer from which the following examples of virtual entities may be provided: virtual servers; virtual storage; virtual networks, including virtual private networks; virtual applications and operating systems; and virtual clients. In one example, management layer 604 may provide the functions described below. Resource provisioning provides dynamic procurement of computing resources and other resources that are utilized to perform tasks within the cloud computing environment. Metering and Pricing provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal provides access to the cloud computing environment for consumers and system administrators. Service level management provides cloud computing resource allocation and management such that required service levels are met. Service Level Agreement (SLA) planning and fulfillment provide pre-arrangement for, and procurement of, cloud computing resources for which a future requirement is anticipated in accordance with an SLA.

Workloads layer 606 provides examples of functionality for which the cloud computing environment may be utilized. Examples of workloads and functions which may be provided from this layer include: mapping and navigation; software development and lifecycle management; virtual classroom education delivery; data analytics processing; transaction processing; and modifying a circuit based on a pre routed top level design.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system for modifying a circuit based on pre routed top level designs comprising:
   a processor to:
   detect a previous routed top level circuit design that includes a timing within a predetermined range and congestion below a threshold level;
   determine a new pin for adding to a new circuit design;
   detect user input indicating a bounding box corresponding to a new macro boundary in the previous routed top level circuit design;
   determine a net is between a first macro within the bounding box and a second macro outside of the bounding box;
   detect a normalized location of the new pin based on an edge of the bounding box; and
   place the new pin at the normalized location of the edge of the bounding box;
   identify a location of the net in the previous circuit design corresponding to the new pin, wherein the new pin is placed at an intersection between the net and the bounding box; and
   manufacture a circuit based on the new circuit design, the new circuit design comprising the previous circuit design and the placement of the new pin at the intersection between the net and the bounding box.

2. The system of claim 1, wherein the processor is to identify a layer and a track for the new pin based on the net.

3. The system of claim 1, wherein the processor is to detect a size of the new pin based on a predetermined characteristic corresponding to a layer of the net.

4. The system of claim 1, wherein the normalized location is based on a coordinate corresponding to a corner or the edge of the bounding box.

5. The system of claim 1, wherein the processor is to search a plurality of buffers to identify the bounding box.

6. The system of claim 1, wherein the processor is to:
   detect at least two nets in the previous circuit design for placing the new pin; and
   select one of the at least two nets based on a level of congestion.

7. The system of claim 1, wherein the processor is to:
   detect that a normalized location in the previous circuit design for placing the new pin cannot be located; and
   generate a pin not found list and identify a location for the new pin based on a flight line between a first macro inside the bounding box and a second macro outside of the bounding box that is to be connected to the first macro and an intersection of the flight line with the bounding box.

8. A method for modifying a circuit based on pre routed top level designs comprising:
   detecting a previous routed top level circuit design that includes timing within a predetermined range and congestion below a threshold level;
   determining a new pin for adding to a new circuit design;
   detecting user input indicating a bounding box corresponding to a new macro boundary in the previous routed top level circuit design;
   determine a net is between a first macro within the bounding box and a second macro outside of the bounding box;
   detect a normalized location of the new pin based on an edge of the bounding box; and
   place the new pin at the normalized location of the edge of the bounding box;
   identifying a location of the net in the previous circuit design corresponding to the new pin, wherein the new pin is placed at an intersection between the net and the bounding box; and
   manufacturing a circuit based on the new circuit design, the new circuit design comprising the previous circuit design and the placement of the new pin at the intersection between the net and the bounding box.

9. The method of claim 8, comprising identifying a layer and a track for the new pin based on the net.

10. The method of claim 8, comprising detecting a size of the new pin based on a predetermined characteristic corresponding to a layer of the net.

11. The method of claim 8, wherein the normalized location is based on a coordinate corresponding to a corner or the edge of the bounding box.

12. The method of claim 8, comprising searching a plurality of buffers to identify the bounding box.

13. The method of claim 8, comprising:
    detecting at least two nets in the previous circuit design for placing the new pin; and
    selecting one of the at least two nets based on a level of congestion.

14. The method of claim 8, comprising:
    detecting that a normalized location in the previous circuit design for placing the new pin cannot be located; and
    generating a pin not found list and identify a location for the new pin based on a flight line between a first macro inside the bounding box and a second macro outside of the bounding box that is to be connected to the first macro and an intersection of the flight line with the bounding box.

15. A computer program product for modifying a circuit based on pre routed top level designs, the computer program product comprising a computer readable storage medium having program instructions embodied therewith, wherein the computer readable storage medium is not a transitory signal per se, the program instructions executable by a processor to cause the processor to:
    detect a previous routed top level circuit design that includes a timing within a predetermined range and congestion below a threshold level;
    determine a new pin for adding to a new circuit design;
    detect user input indicating a bounding box corresponding to a new macro boundary in the previous routed top level circuit design;
    determine a net is between a first macro within the bounding box and a second macro outside of the bounding box;
    detect a normalized location of the new pin based on an edge of the bounding box; and
    place the new pin at the normalized location of the edge of the bounding box;
    identify a location of the net in the previous circuit design corresponding to the new pin, wherein the new pin is placed at an intersection between the net and the bounding box; and
    manufacture a circuit based on the new circuit design, the new circuit design comprising the previous circuit design and the placement of the new pin at the intersection between the net and the bounding box.

16. The computer program product of claim 15, wherein the processor is to identify a layer and a track for the new pin based on the net.

17. The computer program product of claim 15, wherein the processor is to detect a size of the new pin based on a predetermined characteristic corresponding to a layer of the net.

* * * * *